US010291852B2

(12) United States Patent
Wippermann et al.

(10) Patent No.: US 10,291,852 B2
(45) Date of Patent: May 14, 2019

(54) MULTI-APERTURE IMAGING DEVICE, IMAGING SYSTEM AND METHOD FOR PROVIDING A MULTI-APERTURE IMAGING DEVICE

(71) Applicant: Fraunhofer-Gesellschaft zur Foerderung der angewandten Forschung e.V., Munich (DE)

(72) Inventors: Frank Wippermann, Meiningen (DE); Andreas Brueckner, Jena (DE); Andreas Braeuer, Schloeben (DE); Alexander Oberdoerster, Jena (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 15/605,200

(22) Filed: May 25, 2017

(65) Prior Publication Data
US 2017/0264825 A1    Sep. 14, 2017

Related U.S. Application Data
(63) Continuation of application No. PCT/EP2016/069521, filed on Aug. 17, 2016.

(30) Foreign Application Priority Data
Aug. 19, 2015  (DE) .......................... 10 2015 215 840

(51) Int. Cl.
H04N 5/232      (2006.01)
H04N 5/225      (2006.01)
(Continued)

(52) U.S. Cl.
CPC ........... *H04N 5/23287* (2013.01); *G02B 7/09* (2013.01); *G02B 13/001* (2013.01);
(Continued)

(58) Field of Classification Search
CPC ............ H04N 5/23287; H04N 5/2252; H04N 5/23212; H04N 5/2328; H04N 5/23264;
(Continued)

(56) References Cited

U.S. PATENT DOCUMENTS 5,696,616 A * 12/1997 Wagensonner .... G02B 26/0833
                                                       347/134
5,937,212 A *  8/1999 Kurahashi .............. G03B 37/02
                                                        396/20
(Continued)

FOREIGN PATENT DOCUMENTS

CN    101401023 A    4/2009
DE   102014213371 B3   8/2015
(Continued)

OTHER PUBLICATIONS

Wippermann, F. C. et al., "Novel Multi-aperture Approach for Miniaturized Imaging Systems", Optical Sensing II; vol. 9760; Mar. 15, 2016; pp. 97600S97600S XP060070249, Mar. 15, 2016, 7 pages.

*Primary Examiner* — Albert H Cutler
(74) *Attorney, Agent, or Firm* — Perkins Coie LLP; Michael A. Glenn

(57) ABSTRACT

A multi-aperture imaging device includes an image sensor and an array of optical channels, each optical channel including optics for projecting a partial field of view of a total field of view on an image sensor area of the image sensor. The multi-aperture imaging device includes a beam deflector for deflecting an optical path of the optical channels and an optical image stabilizer for an image stabilization along a first image axis by generating a translatory relative movement between the image sensor and the array and for an image stabilization along a second image axis by generating a rotational movement of the beam deflector.

16 Claims, 11 Drawing Sheets

(51) Int. Cl.
  *G02B 7/09*  (2006.01)
  *G02B 13/00*  (2006.01)
  *H01L 27/146*  (2006.01)
  *H01L 31/0232*  (2014.01)
  *G02B 27/64*  (2006.01)

(52) U.S. Cl.
  CPC ...... *G02B 27/646* (2013.01); *H01L 27/14625* (2013.01); *H01L 27/14627* (2013.01); *H01L 31/0232* (2013.01); *H01L 31/02325* (2013.01); *H01L 31/02327* (2013.01); *H04N 5/2252* (2013.01); *H04N 5/2254* (2013.01); *H04N 5/2328* (2013.01); *H04N 5/23212* (2013.01); *H04N 5/23264* (2013.01)

(58) Field of Classification Search
  CPC .......... H04N 5/2254; H04N 3/04; H04N 3/08; H04N 5/23238; H04N 5/3415; H04N 9/09; H04N 9/097; H04N 9/10; H04N 13/239; H04N 13/243; H04N 13/25; G02B 7/09; G02B 13/001; G02B 27/646; H01L 27/14627; H01L 27/14625; H01L 31/02327; H01L 31/02325; H01L 31/0232; G03B 37/02; G03B 37/00; G03B 37/04
  USPC .............................. 348/37, 38; 358/514, 473
  See application file for complete search history.

(56) References Cited

U.S. PATENT DOCUMENTS

| | | | |
|---|---|---|---|
| 6,917,385 B1* | 7/2005 | Narabu | G02B 26/12 348/203 |
| 6,992,699 B1 | 1/2006 | Vance et al. | |
| 7,593,114 B2 | 9/2009 | Corrain | |
| 9,699,379 B1* | 7/2017 | Baldwin | H04N 5/23238 |
| 2007/0159535 A1* | 7/2007 | Kumagai | H04N 5/2254 348/218.1 |
| 2008/0036852 A1* | 2/2008 | Toyoda | G02B 13/06 348/36 |
| 2009/0122406 A1 | 5/2009 | Rouvinen et al. | |
| 2010/0289941 A1* | 11/2010 | Ito | G02B 7/365 348/345 |
| 2015/0109468 A1 | 4/2015 | Laroia | |

FOREIGN PATENT DOCUMENTS

| | | |
|---|---|---|
| JP | 2002171430 A | 6/2002 |
| JP | 2008180773 A | 8/2008 |
| JP | 2010268078 A | 11/2010 |
| JP | 2011239207 A | 11/2011 |
| WO | 2015005056 A1 | 1/2015 |
| WO | 2015015383 A2 | 2/2015 |
| WO | 2015058150 A1 | 4/2015 |

* cited by examiner

MULTI-APERTURE IMAGING DEVICE, IMAGING SYSTEM AND METHOD FOR PROVIDING A MULTI-APERTURE IMAGING DEVICE

CROSS-REFERENCE TO RELATED APPLICATIONS

This application is a continuation of copending International Application No. PCT/EP2016/069521, filed Aug. 17, 2016, which is incorporated herein by reference in its entirety, and additionally claims priority from German Application No. DE 102015215840.3, filed Aug. 19, 2015, which is incorporated herein by reference in its entirety.

The present invention relates to a multi-aperture imaging device, to an imaging system and to a method for providing a multi-aperture imaging device. The present invention further relates to multi-aperture imaging systems with a linear channel arrangement and small or smallest size.

BACKGROUND OF THE INVENTION

Traditional cameras have an imaging channel that projects the whole object field. The cameras have adaptive components that enable a relative lateral two-dimensional displacement between objective and image sensor for realizing an optical image stabilization function. Multi-aperture imaging systems with a linear channel arrangement consist of several imaging channels each of which captures only a part of the object and contains a deflecting mirror.

Concepts for a multi-channel detection of object areas or fields of view that enable a compact realization would be desirable.

SUMMARY

According to an embodiment, a multi-aperture imaging device may have: an image sensor; an array of the optical channels, wherein each optical channel includes optics for projecting a partial field of view of a total field of view on an image sensor area of the image sensor; a beam deflector for deflecting an optical path of the optical channels; and an optical image stabilizer for an image stabilization along a first image axis by generating a translatory relative movement between the image sensor and the array and for an image stabilization along a second image axis by generating a rotational movement of the beam deflector.

According to another embodiment, an imaging system may have an inventive multi-aperture imaging device, wherein the imaging system is implemented as a portable system.

According to another embodiment, a method for providing a multi-aperture imaging device may have the steps of: providing an image sensor; arranging an array of optical channels, wherein each optical channel includes optics for projecting a partial field of view of a total field of view on an image sensor area of the image sensor; arranging a beam deflector for deflecting an optical path of the optical channels; and arranging an optical image stabilizer for an image stabilization along a first image axis by generating a translatory relative movement between the image sensor and the array and for an image stabilization along a second image axis by generating a rotational movement of the beam deflector.

One finding of the present invention is having recognized that the above object may be achieved by obtaining optical image stabilization along an image axis that is detected by the multi-aperture imaging device of an image, by generating a rotational movement of a beam-deflecting means that deflects the optical path of optical channels, so that a translatory movement along the respective image direction between an imaging channel and an image sensor may be reduced or avoided. Such a reduced extent of translatory movements enables reduced construction height and therefore a compact, i.e. having a small construction space, and, particularly with regard to achieving a small construction height or thickness, advantageous implementation of the multi-aperture imaging device.

According to an embodiment, a multi-aperture imaging device includes an image sensor, an array of optical channels, a beam-deflecting means and an optical image stabilizer. Each optical channel of the array of optical channels includes optics for projecting a partial field of view of a total field of view on an image sensor area of the image sensor. The beam-deflecting means is configured to deflect an optical path of the optical channels. The optical image stabilizer is configured to generate, for image stabilization along a first image axis, a translatory relative movement between the image sensor and the array and to generate, for image stabilization along a second image axis, a rotational movement of the beam-deflecting means. Based on the rotational movement, a low consumption of construction space may be achieved along the second image axis. Based on the rotational movement, a configuration, wherein an actuator for generating a translatory movement along a first axis between an image sensor and optics has to be moved by an actuator for generating a translatory movement along a second axis, may further be avoided According to a further embodiment, the image stabilizer includes at least one actuator. The at least one actuator is at least partially arranged between two planes that are spanned (defined) by sides of a cuboid, the sides of the cuboid being aligned parallel to each other as well as to a line extension direction of the array and a part of the optical path of the optical channels between the image sensor and the beam-deflecting means, and the volume of the same being minimal and nevertheless including the image sensor, the array and the beam-deflecting means. If a direction, for example a thickness direction, is perpendicular to at least one plane, this enables a small thickness of the multi-aperture imaging device or of a system comprising the multi-aperture image device.

According to a further embodiment, a multi-aperture imaging device includes a focussing means including at least one actuator for adjusting the focus of the multi-aperture imaging device. The focussing means is at least partially arranged between two planes that are spanned by sides of a cuboid, the sides of the cuboid being aligned parallel to each other as well as to a line extension direction of the array and a part of the optical path of the optical channels between the image sensor and the beam-deflecting means, and the volume of the same being minimal and nevertheless including the image sensor, the array and the beam-deflecting means. This is advantageous in that, by arranging the actuator in the plane, a consumption of construction space along a direction that is perpendicular to the plane may be low.

According to a further embodiment, the array of optical channels is formed in a single line. A single-line implementation of the array of optical channels enables small spatial extension of the array and/or the multi-aperture imaging device along a direction that is perpendicular to a line extension direction of the array, which may enable further reduced dimensions of the devices.

Further embodiments relate to an imaging system and to a method for providing a multi-aperture imaging device.

BRIEF DESCRIPTION OF THE DRAWINGS

Embodiments of the present invention will be detailed subsequently referring to the appended drawings, in which:

FIG. 2b is a schematic side sectional view of the multi-aperture imaging device of FIG. 2a;

DETAILED DESCRIPTION OF THE INVENTION

Figure 1A:
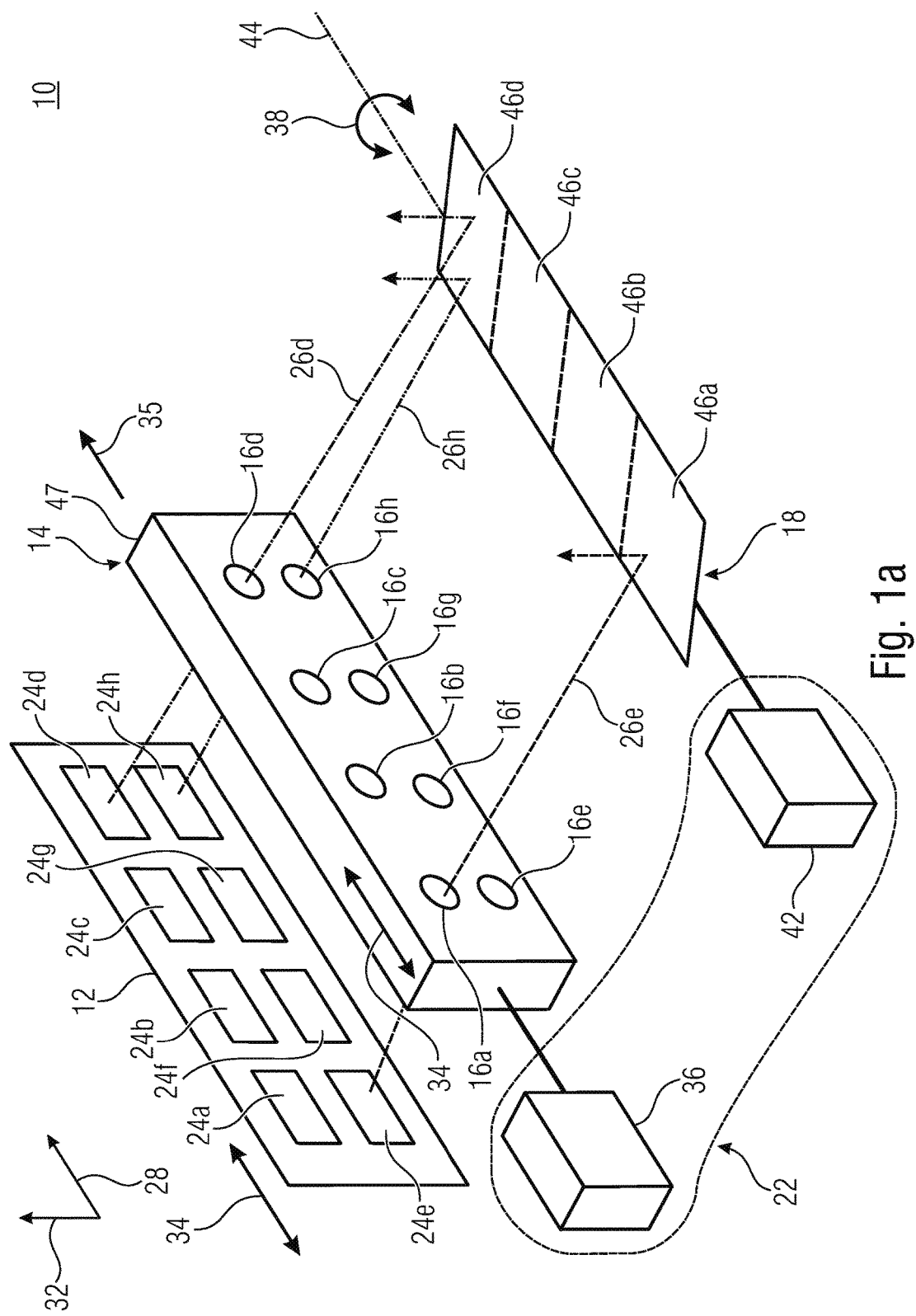
FIG. 1a is a schematic view of a multi-aperture imaging device according to an embodiment.

Before embodiments of the present invention are subsequently discussed referring to the appended drawings, it should be understood that identical, elements, objects and/or structures or those having the same function or the same effect in different figures are provided with the same reference numerals so that a description of these elements as represented in different embodiments is mutually exchangeable or applicable.

FIG. 1a shows a schematic view of a multi-aperture imaging device 10 according to an embodiment. The multi-aperture imaging device 10 includes an image sensor 12, an array 14 of the optical channels 16a-h, a beam-deflecting means 18, and an optical image stabilizer 22. Each optical channel 16a-h includes optics for projecting a partial field of view of a total field of view on an image sensor area 24a-h of the image sensor 12. Optical channels may be understood as courses of optical paths. The optical paths may comprise at least one optics element that is arranged in the array 14. The single optical channels may each form complete imaging optics and comprise at least one optical component or optics, for example a refractive, diffractive or hybrid lens, and may project a section of the total object that is captured as a whole using the multi-aperture imaging device. An aperture diaphragm may be arranged with regard to the optical channels.

The image sensor areas 24a-h, for example, may each be formed from a chip that includes a corresponding pixel array, wherein the image sensor areas may be mounted on a common substrate or a common circuit carrier, such as a common board or a common flex board. Of course, it would alternatively also be possible that the image sensor areas 24a-h are each formed from a part of a common pixel array that continuously extends across the image sensor areas 24a-h, the common pixel array, for example, being formed on a single chip. In this case, for example, only pixel values of the common pixel array in image sensor areas 24a-h are read out. Of course, different mixes of said alternatives are also possible, for example the presence of one chip for two or more channels and of a further chip for, again, different channels or the like. In the case of several chips of the image sensor 12, the same may be mounted, for example, on one or more boards or circuit carriers, for example all together or group-wise or the like.

The beam-deflecting means 18 is configured to deflect an optical path 26 of the optical channels 16a-h. The image stabilizer 22 is configured to enable optical image stabilization along a first image axis 28 and along a second image axis 32, based on a relative movement between the image sensor 12, the array 14, and the deflecting means 18. The first image axis 28 and the second image axis 32 may be influenced by an arrangement or alignment of the image sensor areas 24a-h or the image sensor 12. According to an embodiment, the image axes 28 and 32 are arranged perpendicular to each other and/or coincide with extension directions of pixels of the image sensor areas 24a-d. The image axes 28 and 32 may alternatively or additionally indicate an orientation along which a partial field of view or the total field of view is sampled or detected. In simple terms, the image axes 28 and 32 may be a first and second direction, respectively, in an image that is detected by the multi-aperture imaging device 10. The image axes 28 and 32, for example, comprise an angle to each other that is ≠0°, for example may be arranged spatially perpendicular to each other.

Optical image stabilization may be advantageous, if, during a detection operation during which partial fields of view or the total field of view is detected, the multi-aperture imaging device 10 is moved relative to the object area whose field of view is detected. The optical image stabilizer 22 may be configured to at least partially counteract this movement, in order to reduce or prevent blurring of the image. For this, the optical image stabilizer 22 may be configured to generate a translatory relative movement 34 between the image sensor 12 and the array 14. For this, the optical image stabilizer 22 may comprise an actuator 36 that is configured to generate the translatory relative movement 34. Although the actuator 36 is represented such that it displaces or moves the array 14 in a translatory manner, the actuator 36 according to further embodiments may alternatively or additionally be connected to the image sensor 12 and configured to move the image sensor 12 relative to the array 14. The relative movement 34 may be performed in parallel to a line extension direction 35 and perpendicular to the optical paths 26. However, it may be advantageous to set in motion the array 14 with regard to the image sensor 12 in a translatory manner, for example in order to apply a small or no mechanical load to an electrical connection of the image sensor 12 with regard to other components.

The optical image stabilizer 22 may be configured to generate or enable a rotational movement 38 of the beam-deflecting means 18. For this, the optical image stabilizer 22 may, for example, comprise an actuator 42 that is configured to generate the rotational movement 38. Based on the translatory relative movement 34, optical image stabilization along an image direction may be obtained in parallel thereto, for example along or opposite to the image axis 28. Based on the rotational movement 38, optical image stabilization along an image direction that is arranged perpendicular to a rotation axis 44 of the rotational movement 38 in a main side plane of the image sensor 12, for example along the image axis 32, may be obtained. A main side may be understood as a side that comprises a large or largest dimension compared to other sides. Alternatively or additionally, a focussing means, for example as described in connection with FIG. 3, may be arranged that is configured to change a focus of the multi-aperture imaging device.

In simple terms, instead of a translatory movement perpendicular to the relative movement 34, the rotational movement 38 may be used in order to obtain optical image stabilization along the second image axis 32. This makes it possible to reduce a construction space that may be used for enabling the translatory relative movement perpendicular to the relative movement 34. The translatory relative movement may, for example, be arranged perpendicular to a thickness direction of the device, so that the device may be implemented with a small thickness, i.e. thin. This is advantageous particularly in the field of mobile devices, as the same may be implemented with a flat housing.

The array 14 may, for example, comprise a carrier 47 through which the optical channels 16a-h pass. The carrier 47, for example, may be configured in an opaque manner and may comprise transparent areas for the optical channels 16a-h. Optics of the optical channels 16a-h may be arranged within or adjacent to the transparent areas and/or at end areas thereof. Alternatively or additionally, the carrier 47 may be formed transparently and, for example, may comprise a polymeric material and/or a glass material. At a surface of the carrier 47 optics (lenses) that influence the projection of the respective partial field of view of the total field of view on the respective image sensor area 24a-h of the image sensor may be arranged.

The actuators 36 and/or 42 may, for example, be formed as pneumatic actuator, hydraulic actuator, piezoelectric actuator, direct current motor, stepper motor, thermally actuated actuator, electrostatic actuator, electrostrictive actuator, magnetostrictive actuator or voice-coil drive.

The beam-deflecting means 18 may be formed to be reflective in areas. The beam-deflecting means 18 may, for example, comprise areas or beam-deflecting elements 46a-d that are configured to deflect the optical paths 26 such that the deflected optical paths comprise a mutually different angle and detect a mutually different partial field of view of a total field of view. The different angles may be generated by the beam-deflecting means 18 and/or optics of the optical channels 16a-h. The areas 46a-d may, for example, be formed as facets of a facet mirror. With regard to the array 14, the facets may comprise a mutually different tilt. This may enable deflection, influence, control and/or scattering of the optical paths 26 towards partial fields of view that are arranged differently from one another. Alternatively, the beam-deflecting means 18 may be configured as a surface that is reflective on one or both sides, for example as a mirror. The face may be formed to be planar or continuously curved in sections or planar and/or may be formed to be discontinuously curved in sections or planar. A deflection of optical paths 26 may alternatively or additionally be obtained by means of the optics of the optical channels 16a-h.

In other words, the mirror (beam-deflecting means) may be planar across the area of all the channels, may comprise a continuous or discontinuous profile, and/or may be planar in pieces, i.e. facetted, the transitions between single continuous or discontinuous profiles additionally comprising local masks for decreasing reflectivity or mechanical structures in order to reduce image errors or to enable stiffening of the structure, so that there are only few motion-induced or thermally induced image errors.

Switching between the first position and the second position of the beam-deflecting means may be performed in a translatory manner along the rotational axis 44. Movement along the rotational axis 44 may be performed continuously or discontinuously, for example in a bistable or multiply stable manner. This may be understood, for example, as position-discrete positions between which the beam-deflecting means 18 is moved. Simply stable, bistable or multiply stable positions, for example, may be obtained by configuring the actuator 42 or another actuator as a stepper motor. If the beam-deflecting means 18, for example, is configured to be moved back and forth between two positions, one of the positions may, for example, be an idle position of the actuator or be based thereon. The actuator may, for example, be configured to perform the translatory movement relative to a spring force that, when arriving at the respective other position, exerts a counterforce that, upon removal of the force of the actuator, moves the beam-deflecting means back to the starting position of the same. This means that a stable position may also be obtained in areas of a force diagram that do not comprise a local force minimum. This may, for example, be a force maximum. Alternatively or additionally, a stable position may be obtained based on magnetic or mechanical forces between the beam-deflecting means 18 and an adjacent housing or substrate. This means that the actuator 42 or the other actuator for a translatory movement of the beam-deflecting means may be configured in order to move the beam-deflecting means into a bistable or multiply stable position. Alternatively, simple mechanical stops may be provided for bistable arrangements of the positions that define two end positions between which a position switching in the defined end positions is performed.

Figure 1B:
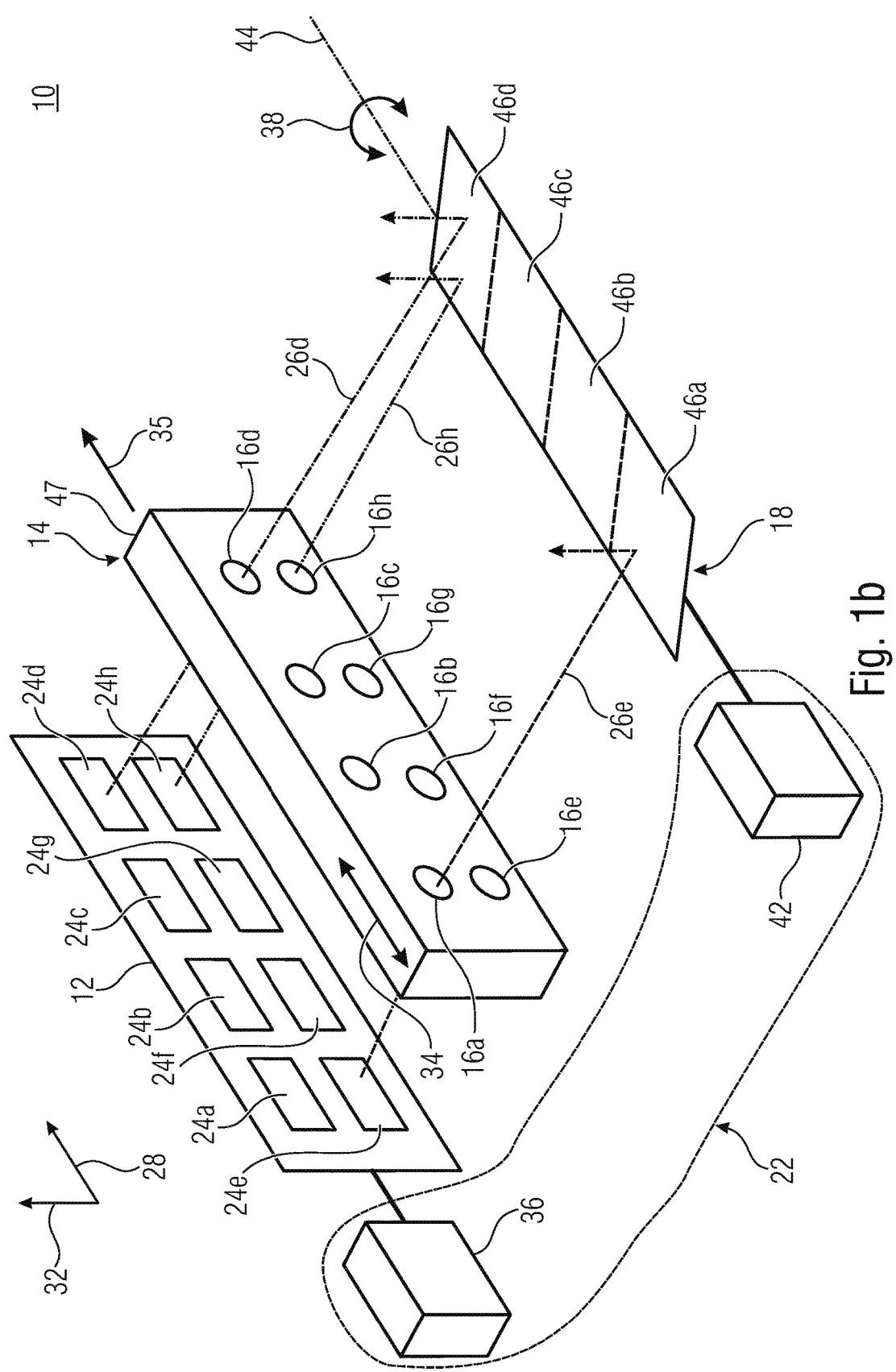
FIG. 1b is a schematic view of a multi-aperture imaging device according to an embodiment, in which an actuator is connected to an image sensor.

FIG. 1b shows a schematic view of a multi-aperture imaging device 10' according to one embodiment. The multi-aperture imaging device 10' is modified with regard to the multi-aperture imaging device 10, in that the actuator 36 is mechanically connected to the image sensor 12 and configured to move the image sensor 12 relative to the array 14. The relative movement 34 may be performed in parallel to the line extension direction 35 and perpendicular to the optical paths 26.

Figure 2A:
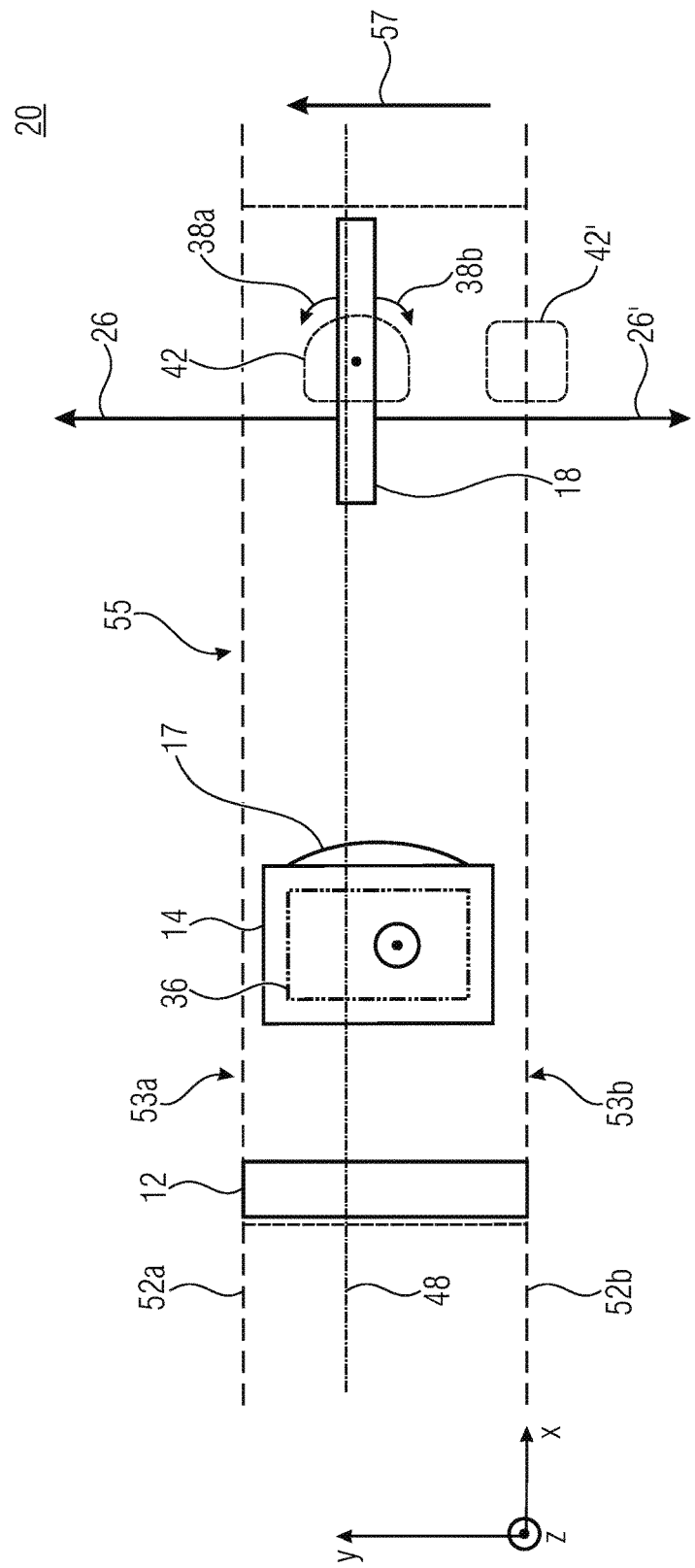
FIG. 2a is a schematic side sectional view of a further multi-aperture imaging device according to an embodiment.

FIG. 2a shows a schematic side sectional view of a multi-aperture imaging device 20 according to an embodiment. The multi-aperture imaging device 20 may, for example, modify the multi-aperture imaging device 10 such that the actuators 36 and/or 42 are arranged to be at least partially arranged between two planes 52a and 52b that are spanned by sides 53a and 53b of a cuboid 55. The sides 53a and 53b of the cuboid 55 may be parallel to each other as well as parallel to the line extension direction of the array and of a part of the optical path of the optical channels between the image sensor and the beam-deflecting means. The volume of the cuboid 55 is minimal but nevertheless includes the image sensor 12, the array 14, and the beam-deflecting means 18 as well as movements of the same caused by operation. Optical channels of the array 14 comprise optics 17 that may be formed identical or mutually different for each optical channel.

A volume of the multi-aperture imaging device may comprise a small or minimal construction space between the planes 52a and 52b. Along the lateral sides or extension directions of plane 52a and/or 52b, a construction space of the multi-aperture imaging device may be large or of any size. The volume of the virtual cuboid is, for example, influenced by an arrangement of the image sensor 12, the single-line array 14, and the beam-deflecting means, the arrangement of these components according to embodiments described herein being such that the construction space of these components along the direction perpendicular to the planes, and therefore the distance of planes 52a and 52b to each other, becomes small or minimal. With regard to other arrangements of the components, the volume and/or the distance of other sides of the virtual cuboid may be enlarged.

The virtual cuboid 55 is represented by dotted lines. The planes 52a and 52b may comprise two sides of the virtual cuboid 55 or may be spanned by the same. A thickness direction 57 of the multi-aperture imaging device 20 may be arranged normal to plane 52a and/or 52b and/or in parallel to the y-direction.

The image sensor 12, the array 14, and the beam-deflecting means 18 may be arranged such that a perpendicular distance between the planes 52a and 52b along the thickness direction 57, which, simplifying but not limiting, is referred to as height of the cuboid, is minimal, wherein a minimization of the volume, i.e. the other dimensions of the cuboid, may be omitted. An extension of the cuboid 55 along the direction 57 may be minimal and substantially dictated by the extension of optical components of the imaging channels, i.e. the array 14, the image sensor 12, and the beam-deflecting means 18, along the direction 57.

A volume of the multi-aperture imaging device may comprise a small or minimal construction space between the planes 52a and 52b. Along the lateral sides or extension directions of planes 52a and/or 52b, a construction space of the multi-aperture imaging device may be large or of any size. The volume of the virtual cuboid, for example, is influenced by an arrangement of the image sensor 12, the single-line array 14, and the beam-deflecting means, the arrangement of these components according to the embodiments described herein being performed such that the construction space of these components along the direction perpendicular to the planes, and therefore the distance of planes 52a and 52b to each other, becomes small or minimal. With regard to other arrangements of the components, the volume and/or the distance of other sides of the virtual cuboid may be enlarged.

The actuators, for example the actuator 36 and/or 42 of the multi-aperture imaging device, may comprise a dimension or extension in parallel to the direction 57. A percentage of a maximum of 50%, a maximum of 30% or a maximum of 10% of the dimension of the actuator or the actuators may, based on an area between the planes 52a and 52b, protrude beyond plane 52a and/or 52b or protrude from the area. This means that the actuators only inessentially protrude beyond plane 52a and/or 52b. According to embodiments, the actuators do not protrude beyond the planes 52a and 52b. This is advantageous in that an extension of the multi-aperture imaging device 10 along the thickness direction or the direction 57 is not enlarged by the actuators.

The image stabilizer 22 and the actuators 36 and/or 42 may comprise a dimension or extension in parallel to the thickness direction 57. A percentage of a maximum of 50%, a maximum of 30% or a maximum of 10% of the dimension may, based on an area between the planes 52a and 52b, protrude beyond plane 52a and/or 52b or protrude from the area, as represented, for example, for the actuator 42' indicating an offset arrangement of the actuator 42. This means that the actuators 36 and/or 42 only inessentially protrude beyond planes 52a and/or 52b. According to embodiments, the actuators 36 and/or 42 do not protrude beyond the planes 52a and 52b. This is advantageous in that an extension of the multi-aperture imaging device 20 along the thickness direction 57 is not enlarged by the actuators 36 or 42.

Although terms like "top", "down", "left", "right", "in front" or "behind" used herein are used for better illustration, the same should have no restrictive effect whatsoever. It is understood that, based on a rotation or tilting in space, these terms may be mutually substituted. The x-direction, starting from the image sensor 12 towards the beam-deflecting means 18, may, for example, be understood as being in the front or forward. A positive y-direction may, for example, be understood as being on the top. An area along the positive or negative z-direction offside or spaced from the image sensor 12, the array 14, and/or the beam-deflecting means 18 may be understood as being beside the respective component. In simple terms, the image stabilizer may comprise at least one actuator 36 and/or 42. The at least one actuator 36 and/or 42 may be arranged in plane 48 or between the planes 52a and 52b.

In other words, the actuators 36 and/or 42 may be arranged in front of, behind or beside the image sensor 12, the array 14, and/or the beam-deflecting means 18. According to embodiments, the actuators 36 and 42 are arranged to be outside the area between the planes 52a and 52b with a maximum extent of 50%, 30% or 10%. This means that the at least one actuator 36 and/or the image stabilizer 22, along the thickness direction 57 perpendicular to the plane 48, protrudes from the plane or area between the maximum dimensions 52a to 52b by a maximum of 50% of the dimension of the actuator 36 or 42 of the image stabilizer along the thickness direction 57. This enables a small dimension of the multi-aperture imaging device 20 along the thickness direction 57.

Figure 2B:
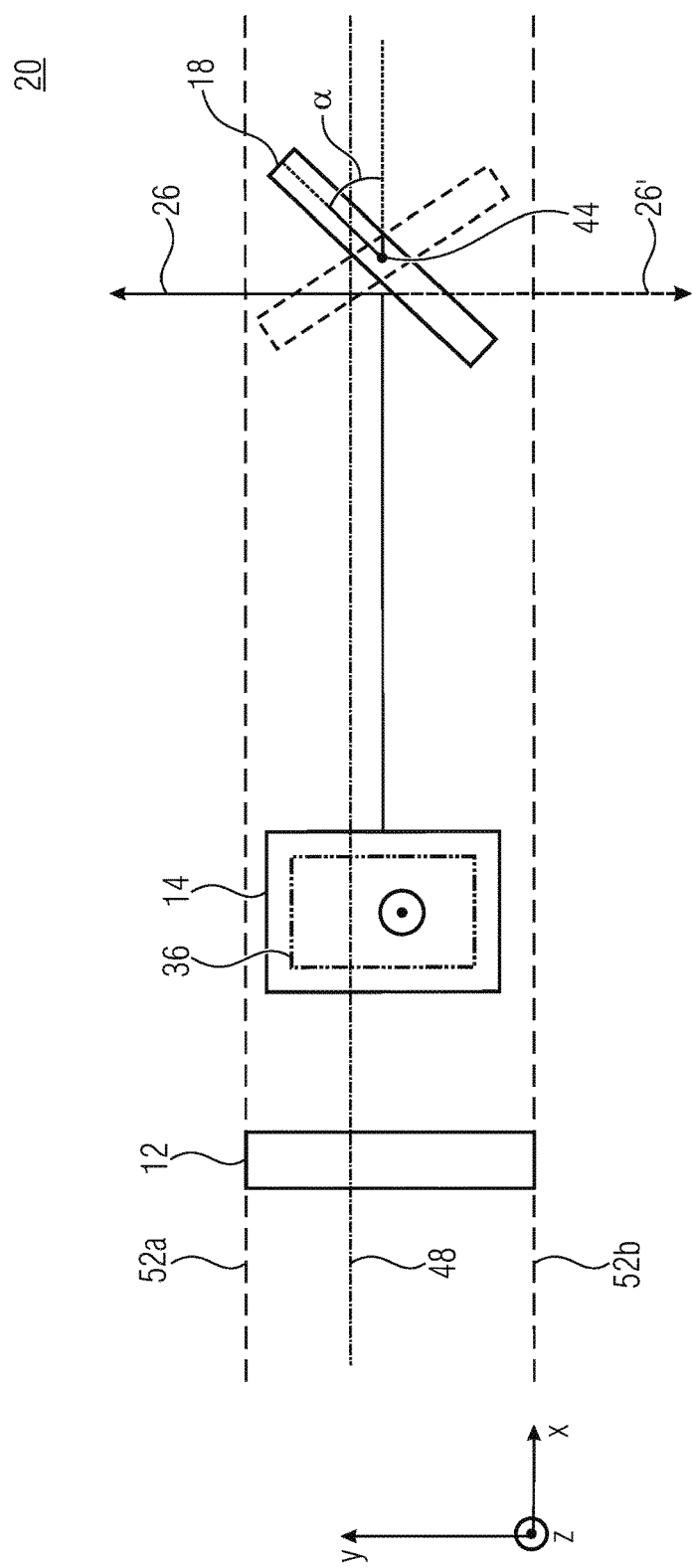

FIG. 2b shows a schematic side sectional view of the multi-aperture imaging device 20, the optical paths 26 and 26' indicating different viewing directions of the multi-aperture imaging device 20. The multi-aperture imaging device may be configured to change a tilt of the beam-deflecting means by an angle α so that alternately different main sides of the beam-deflecting means 18 are arranged to face the array 14. The multi-aperture imaging device 20 may include an actuator that is configured to tilt the beam-deflecting means 18 by the rotation axis 44. The actuator, for example, may be configured to move the beam-deflecting means 18 into a first position where the beam-deflecting means 18 deflects the optical path 26 of the optical channels of the array 14 in the positive y-direction. For this, the beam-deflecting means 18 may comprise, for example, an angle α of >0° and <90°, of at least 10° and up to 80°, or of at least 30° and up to 50°, for example 45°, in the first position. The actuator may be configured to displace the beam-deflecting means in a second position about the rotation axis 44 such that the beam-deflecting means 18 deflects the optical path of the optical channels of the array 14 towards the negative y-direction, as represented by the optical path 26' and the dotted representation of the beam-deflecting means 18. The beam-deflecting means 18 may, for example, be configured to be reflective on both sides so that in the first position a first optical path 26 or 26' is deflected or reflected.

Figure 3:
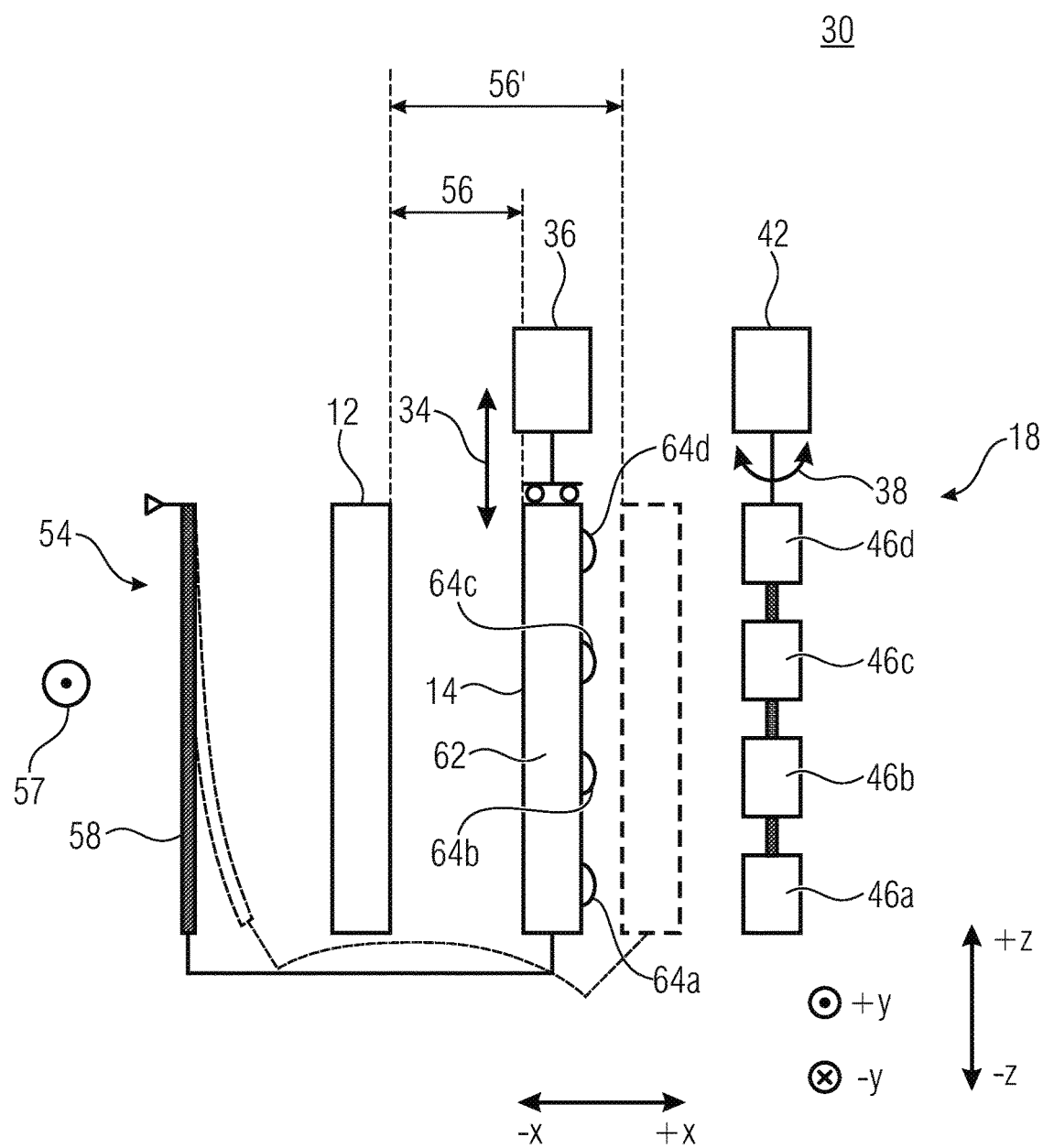
FIG. 3 is a schematic top view of a multi-aperture imaging device according to an embodiment, wherein a beam-deflecting means includes different beam-deflecting elements.

FIG. 3 shows a schematic top view of a multi-aperture imaging device 30 according to an embodiment. The multi-aperture imaging device 30 may be modified with regard to the multi-aperture imaging device 10 and/or 20 such that the multi-aperture imaging device 30 includes a focussing means 54 that is configured to change a focus of the multi-aperture imaging device 30. This may be performed based on a variable distance 56 between the image sensor 12 and the array 14, as represented by the distance 56'.

The focussing means 54 may include an actuator 58 that is configured to deform during actuation and/or to provide a relative movement between the image sensor 12 and the array 14. This is represented exemplarily for the multi-aperture imaging device 30 in a way that the actuator 58 is configured to shift the array 14 along the positive and/or negative x-direction with regard to the image sensor 12. The array 14 may, for example, be positioned at one side such that the same, based on an actuation of the actuator 58, is moved along a positive or negative x-direction and remains substantially unmoved along a positive and/or negative z-direction. An additional movement along the positive and/or negative z-direction for optical image stabilization may, for example, be obtained based on an actuation of the actuator 36. According to further embodiments, the actuator 58 or the focussing means 54 is configured to obtain the relative movement between the image sensor 12 and the array 14 along the x-axis based on a translatory displacement of the image sensor 12 with regard to the array 14. According to further embodiments, the image sensor 12 and the array 14 may be moved.

According to further embodiments, the focussing means 54 may comprise at least one further actuator. A first actuator and a second actuator may, for example, be arranged at two opposite areas of the array 14 so that during actuation of the actuators a requirement to the positioning of the moved array 14 (alternatively or additionally to the image sensor 12) is reduced. Additionally, the actuator 58 or a further actuator may be configured to keep a distance between the single-line array 14 and the beam-deflecting means 18 substantially constant or exactly constant, even when using no additional actuator, i.e. to move the beam-deflecting means 18 to an extent as is the single-line array 14. The focussing means 54 may be configured to enable an auto-focus function by a relative translatory movement (focussing movement) between the image sensor 12 and the array 14 along a normal to surface of the image sensor 12. Here, the beam-deflecting means 18 may be moved simultaneously to the focussing movement by a corresponding constructive configuration or usage of the actuator 42 or a further actuator. This means that a distance between the array 14 and the beam-deflecting means remains unchanged and/or that the beam-deflecting means 18 is moved simultaneously or with a time offset to an equal or similar extent as the focussing movement so that the same, at least at the time of capturing the field of view by the multi-aperture imaging device, is unchanged compared to the distance before a change in focus. This may be performed such that the beam-deflecting means 18 is moved together, i.e. simultaneously, with the actuator 42 so that a distance between the array 14 and the beam-deflecting means remains constant or is being compensated. This means that a distance between the array 14 and the beam-deflecting means 18 may remain unchanged and/or that the beam-deflecting means 18 may be moved simultaneously or with a time delay in an equal or similar extent as the focussing movement so that the distance between the array 14 and the beam-deflecting means 18 is, at least at a time of capturing the field of view by the multi-aperture imaging device, unchanged compared to a distance before a change of focus. Alternatively, the beam-deflecting means 18 may be in an idle state or be excluded from the autofocus movement.

The actuator 58, for example, may be formed as piezoelectric actuator such as a bending beam (such as a bimorph, trimorph or the like). Alternatively or additionally, the focussing means 54 may include a voice-coil drive, a pneumatic actuator, a hydraulic actuator, a direct-current motor, a stepper motor, a thermally actuated actuator or bending beam, an electrostatic actuator, an electrostrictive and/or a magnetostrictive drive.

As described in the context of the image stabilizer and an arrangement of the same in plane 48 or in an area between the planes 52a and 52b, the at least one actuator 58 of the focussing means 54 may at least partially be arranged between the planes 52a and 52b. Alternatively or additionally, the at least one actuator 58 may be arranged in a plane in which the image sensor 12, the array 14, and the beam-deflecting means 18 are arranged. Exemplarily, the actuator 58 of the focussing means 54 may, along the thickness direction 57 perpendicular to plane 48 in which the image sensor 12, the array 14, and the beam-deflecting means 18 are arranged, protrude from the area between the planes 52a and 52b by a maximum of 50% of the dimension of the actuator 58 of the focussing means 54 along the thickness direction 57. According to embodiments, the actuator protrudes from the area between the planes 52a and 52b by a maximum of 30%. According to another embodiment, the actuator 55 protrudes from the area by a maximum of 10% or is completely located within the area. This means that along the thickness direction 57 no additional construction space for the focussing means 54 is needed, which is an advantage. If, for example, the array 14 comprises a transparent substrate (carrier) 62 with lenses 64a-d arranged thereon, a dimension of the array 14 and, if need be, the multi-aperture imaging device 30 along the thickness direction 57 may be small or minimal. Referring to FIG. 2a, this might mean that the cuboid 55 comprises a small thickness along direction 57 or that the thickness is not influenced by the substrate 62. The substrate 62 may be passed through by the optical paths that are used for projection in single optical channels. The optical channels of the multi-aperture imaging device may pass through the substrate 62 between the beam-deflecting means 18 and an image sensor 12.

Lenses 64a-d, for example, may be liquid lenses, i.e. an actuator may be configured to control the lenses 64a-d. Liquid lenses may be configured to adapt and vary refractive power and therefore focal length and image location individually channel per channel.

Figure 4:
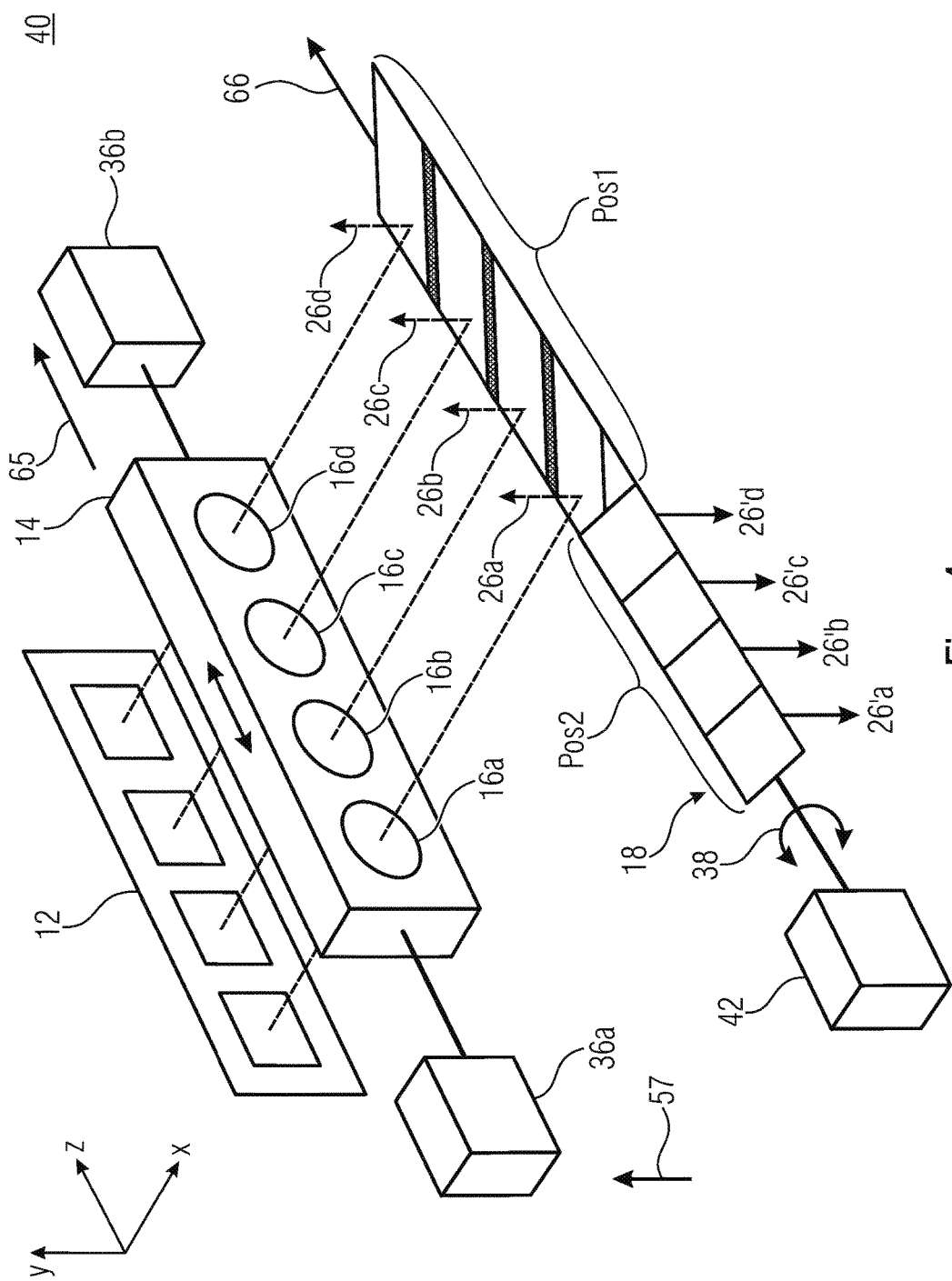
FIG. 4 is a schematic perspective view of a multi-aperture imaging device with optical channels arranged in a single-line manner according to an embodiment.

FIG. 4 shows a schematic perspective view of the multi-aperture imaging device 40 according to an embodiment. Compared to the multi-aperture imaging device 10, the array 14, for example, is configured with a single line, i.e. all optical channels 16a-d may be arranged in a single line along a line extension direction of the array 14. The term "single line" therefore may indicate the absence of further lines. A single-line configuration of the array 14 enables a smaller dimension of the array and eventually of the multi-aperture imaging device 40 along the thickness direction 57.

The multi-aperture imaging device 40 may be configured to detect fields of view in mutually different directions, based on the beam-deflecting means 18. The beam-deflecting means may, for example, comprise a first position or Pos1 position and a second position or Pos2 position. The beam-deflecting means may be switched between the first position Pos1 and the second position Pos2, based on a translatory or rotary movement. The beam-deflecting means 18 may, for example, be movable in a translatory manner along the line extension direction z of the single-line array 14, as indicated by a translatory movement 66. The translatory movement 66, for example, may be arranged substantially in parallel to a line extension direction 65 along which the at least one line of the array 14 is arranged. The translatory movement may, for example, be used in to place different facets in front of the optics of the optical channel 16 in order to obtain different viewing directions of the multi-aperture imaging device 40. The beam-deflecting means 18 may be configured to direct, in the first position Pos1, the optical paths 26a-d in a first direction, for example at least partially in a positive y-direction. The beam-deflecting means 18 may be configured to direct, in the second position Pos2, the optical paths 26a-d, i.e. of each optical channel, in a direction different from the same, for example at least partially in a negative y-direction. The actuator 42 may, for example, be configured to move the beam-deflecting means 18 from the first position Pos1 to the second position Pos2, based on a movement of the beam-deflecting means 18 along the direction of movement 66. The actuator 42 may be configured to superpose the translatory movement along the direction of movement 66 with the rotational movement 38. Alternatively, the multi-aperture imaging device 40 may include a further actuator that is configured to move the beam-deflecting means along the direction of movement 66 or opposite to the same.

As described in the context of FIG. 2b, the actuator 42 may be configured to obtain the first and second position of the beam-deflecting means 18 based on a rotation thereof. The movement between the first position Pos1 and the second position Pos2 may be superposed with the rotational movement 38 both for a rotational movement for switching between positions and the translatory movement along direction 66.

Figure 5A:
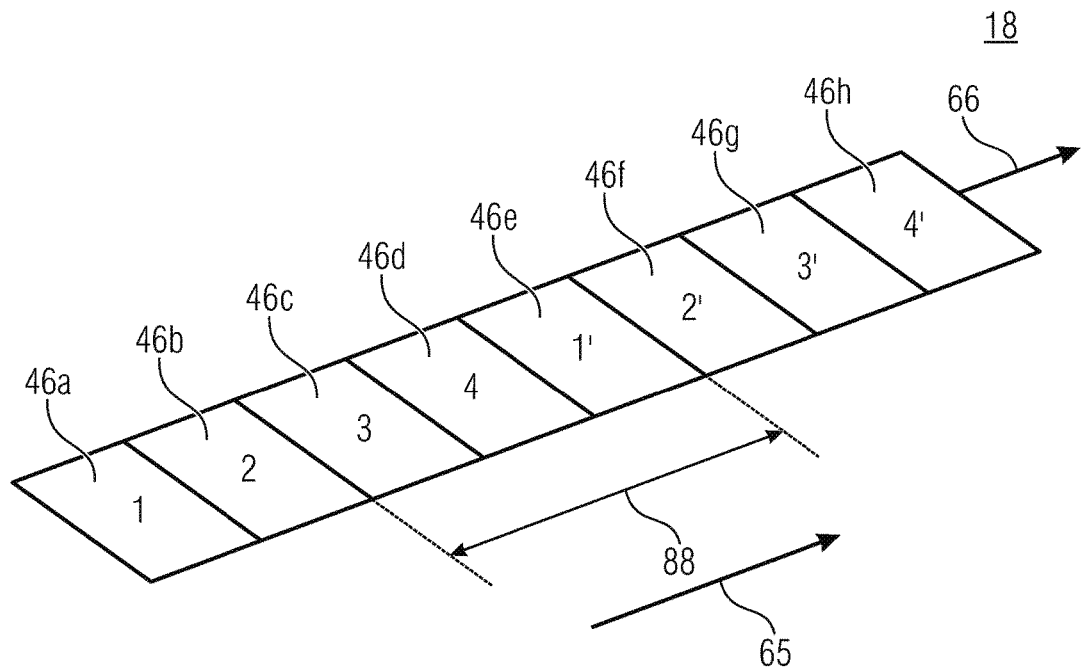
FIG. 5a is a schematic representation of a beam-deflecting means that is formed as an array of facets according to an embodiment.

FIG. 5a shows a schematic view of a beam-deflecting means 18 that is formed as an array of facets 46a-h. If, for example, the beam-deflecting means 18 is positioned in the first position, facets 46a-d that are identified with numbers 1, 2, 3, and 4, respectively, may deflect optical paths of four optical channels in a first direction. If the beam-deflecting means 18 is in the second position, the optical path of each optical channel may be deflected in the second direction, based on facets 46e-h, as identified by numbers 1', 2', 3', and 4', respectively. Facets 46a-d and 46e-h, for example, may be referred to as being arranged in blocks. For a translatory movement of the beam-deflecting means 18 along the translatory direction 66, a distance 88 that substantially corresponds to an extension length of the number of optical channels along the line extension direction 65 may be traveled. According to the embodiment of FIG. 4, for example, this is an extension of four optical channels along a line extension direction 65. According to a further embodiment, the number of beam-deflecting elements can be different from a multiple of optical channels. At least one beam-deflecting element may be configured or arranged in a position of the beam-deflecting means in order to deflect optical paths of at least two optical channels.

Figure 5B:
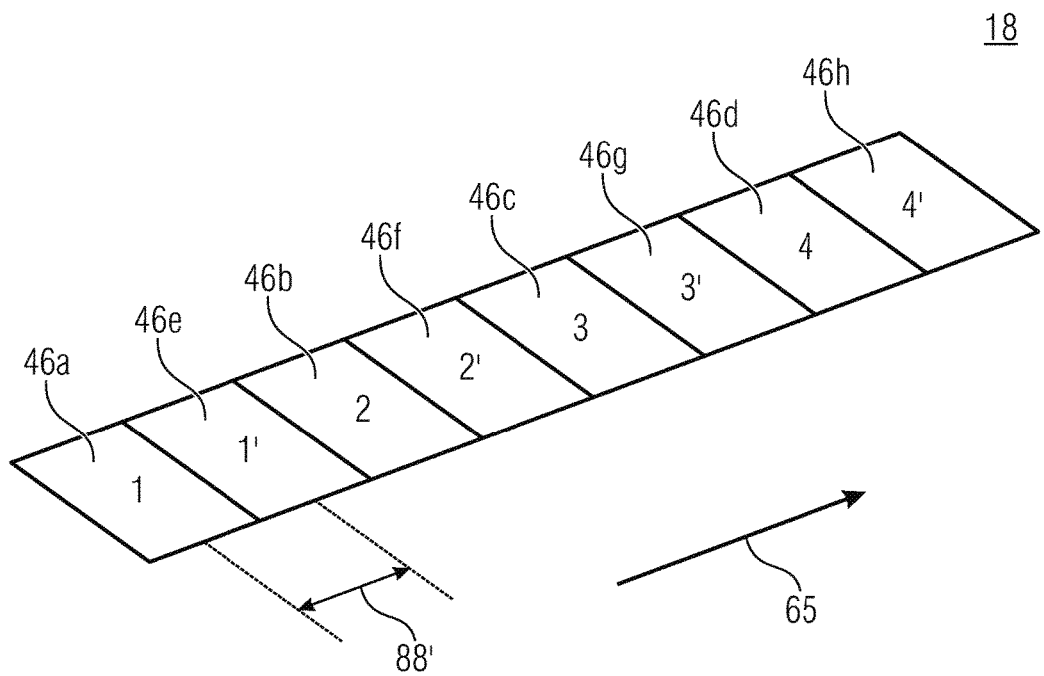
FIG. 5b is a schematic view of the beam-deflecting means according to an embodiment, wherein facets, compared to the representation in FIG. 5a, comprise a mutually different sorting.

FIG. 5b shows a schematic view of the beam-deflecting means 18, wherein facets 46a-g, compared to the representation in FIG. 5a, comprise a mutually different sorting. The beam-deflecting means represented in FIG. 5b comprises an alternate arrangement of the optical channels 46a-g for each optical channel, as represented by the sequence 1, 1', 2, 2', 3, 3', 4, and 4'. This enables a distance 88' along which the beam-deflecting means 18 is being moved in order to be switched between the first position and the second position. The distance 88' may be small, compared to the distance 88 of FIG. 5a. The distance 88' may, for example, substantially correspond to the distance between two adjacent optical channels of the array 14. Two optical channels may, for example, comprise a distance or a space between each other that substantially corresponds to at least one dimension of a facet along the direction of movement 65. The distance 88' may also be different from the same, for example, when a beam-deflecting element is configured or arranged in a position of the beam-deflecting means in order to deflect optical paths of at least two optical channels.

Figure 6:
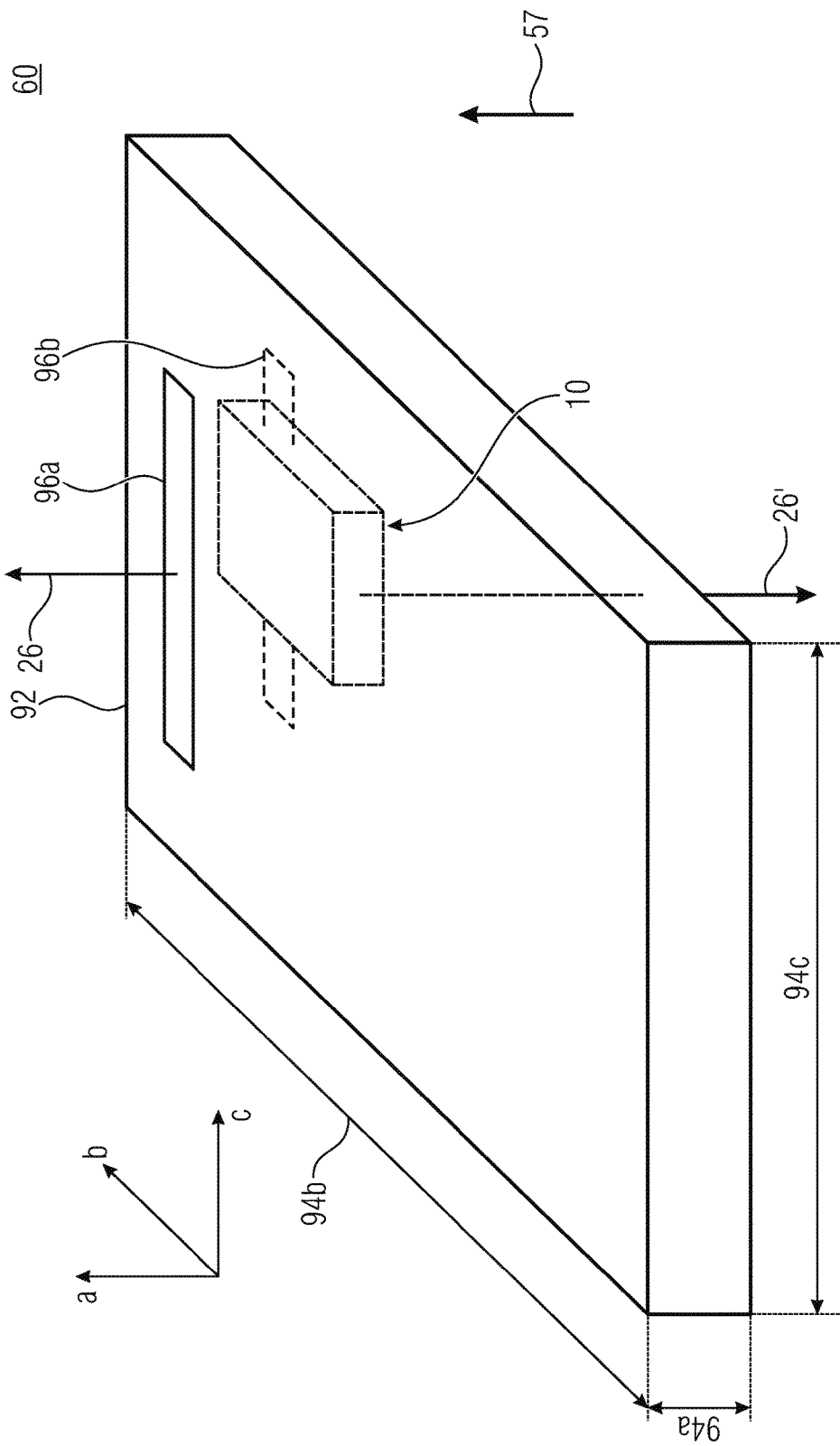
FIG. 6 is a schematic perspective view of an imaging system according to an embodiment.

FIG. 6 shows a schematic perspective view of an imaging system 60 according to an embodiment. The imaging system 60 includes the multi-aperture imaging device 10. According to further embodiments, the imaging system 60 alternatively or additionally to the multi-aperture imaging device 10 includes at least one multi-aperture imaging device 20, 30, and/or 40. The imaging device 60 includes a flat housing 92. The flat housing 92 includes a first extension 94a along a first housing direction a. The flat housing 92 further includes a second extension 94b along a second housing direction b, and a third extension 94c along a third housing direction c. The housing direction a may, for example, be arranged in parallel to the thickness direction 57 in space. The extension 94a of the flat housing 92 along the housing direction a may be understood as smallest dimension of the flat housing 92. Compared to the smallest extension, other extensions 94b and/or 94c along other housing directions b or c may be at least three times the value, at least five times the value or at least seven times the value, compared to the extension 94a along the housing direction a. In simple terms, the extension 94a may be smaller, substantially smaller or, if need be, be smaller by one size than other extensions 94b and 94c along other housing directions b or c.

The flat housing 92 may include one or more diaphragms 96a-b through which the optical path 26 and/or 26' may be deflected, for example based on the beam-deflecting beams of the multi-aperture imaging device 10. The diaphragms may be, for example, electrochromic diaphragms and/or be arranged in an area of the display.

The imaging system 60 may be configured as a portable device. The imaging system 60 may, for example, be a portable communication device such as a mobile telephone or a so-called smartphone, a tablet computer or a portable music playing device. The imaging system 60 may be implemented as a monitor, for example for use in a navigation, multimedia, or television system. Alternatively or additionally, the imaging device 60 may also be arranged behind reflective surfaces such as a mirror.

In the field of mobile communication devices an arrangement of a multi-aperture imaging device 10, 10', 20, 30, and/or 40 may be advantageous, as an extension of the multi-aperture imaging device along the housing direction 94a based on the arrangement of components along the long housing sides 94b and/94c may be small, so that an imaging system 60 may have a small extension 94a. In other words, a relative two-dimensional lateral movement of image sensor and objective that in conventional systems effects a two-dimensional change of angle of the field of view (corresponding to a scanning) may be replaced by a one-dimensional change of viewing direction and a rotational movement. A one-dimensional change of viewing direction may be performed by changing the alignment of the mirror (beam-deflecting means) with regard to the optical axis (line extension direction) of the imaging channels, by bringing the rotationally positioned mirror into another orientation, the rotational axis of the mirror being perpendicular or nearly perpendicular to the optical axis of the imaging channels. For adapting the viewing direction perpendicular to the direction described above, image sensor and/or array objective (array of the optical channels) may be moved laterally to each other. By interaction of both movements, two-dimensional optical image stabilization may be achieved.

In order to enable a small construction height, components arranged for realizing the movement (for example, actuators) and subsystems, such as image processing, may, if need be, be exclusively arranged beside, in front of, and/or behind the space defined by the imaging optical path, i.e. between the planes 52a and 52b, and, according to embodiments, not above or below the same. This enables spatial separation of action units (actuators) for optical image stabilization. Doing this, a reduction of the number of components that may be used may be achieved, manufacturing costs of camera systems may be low and a clear decrease of construction height compared to conventional structures may be achieved. Referring to FIG. 2a, a difference to known systems may be that lenses (optics) of optical channels may substantially define the distance of planes 52a and 52b. This enables a small construction height of the device, which is advantageous. In conventional systems, a main plane of lenses is parallel to planes 52a and 52b, whereas the main plane of optics of the array is arranged orthogonally to the same.

Figure 7:
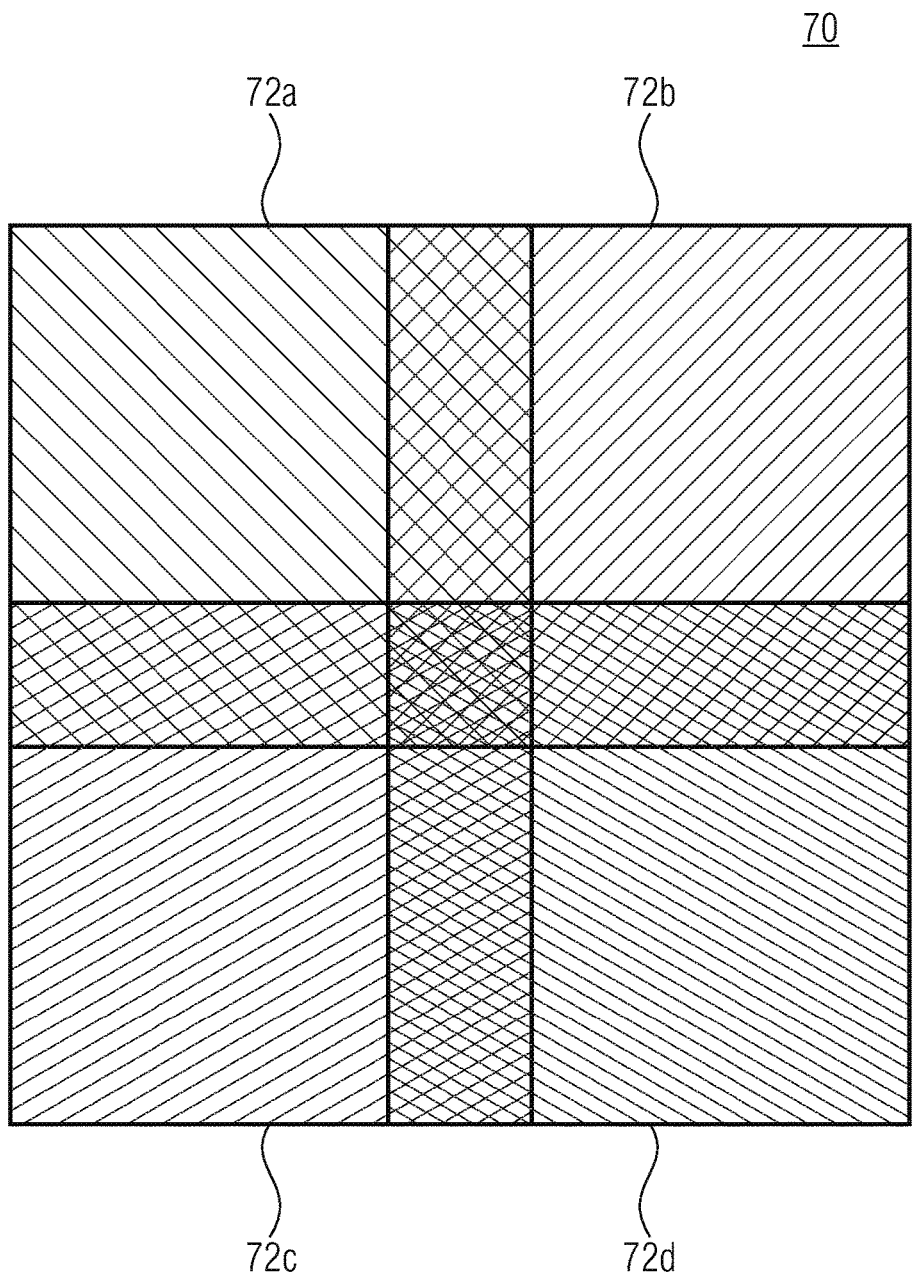
FIG. 7 is a schematic representation of a total field of view according to an embodiment as it may be detected, for example, using a multi-aperture imaging device described herein.

FIG. 7 shows a schematic representation of a total field of view 70, as it may be detected, for example, with a multi-aperture imaging device described herein. The optical paths of the optical channels of the multi-aperture imaging devices may be directed to mutually different partial fields of view 72a-d, wherein each optical channel may be associated to a partial field of view 72a-d. The partial fields of view 72a-d, for example, overlap one another in order to enable joining single partial images to a complete image. If the multi-aperture imaging device comprises a number of optical channels other than four, the total field of view 70 may comprise a number of partial fields of view other than four. Alternatively or additionally, at least a partial field of view 72a-d may be detected by a second or a higher number of optical channels of a higher number of modules (multi-aperture imaging devices) in order to build up stereo, trio, quattro cameras in order to capture three-dimensional object data therewith. Said modules may be configured separately or as a coherent system and may be arranged at any location within the housing 92. The images of different modules that together form the stereo, trio, or quattro cameras, may be offset by fractions of a pixel and configured to implement methods of super resolution. A number of optical channels and/or a number of multi-aperture imaging devices and/or a number of partial fields of view, for example, is arbitrary and may comprise a number of at least two, at least three, at least four, at least ten, at least 20 or an even higher value. Optical channels of the further line may also capture partial areas overlapping one another and together cover the total field of view. This enables a stereo, trio, quattro, etc. structure of array cameras that consist of channels that partially overlap and cover the total field of view within their sub-group.

Figure 8:
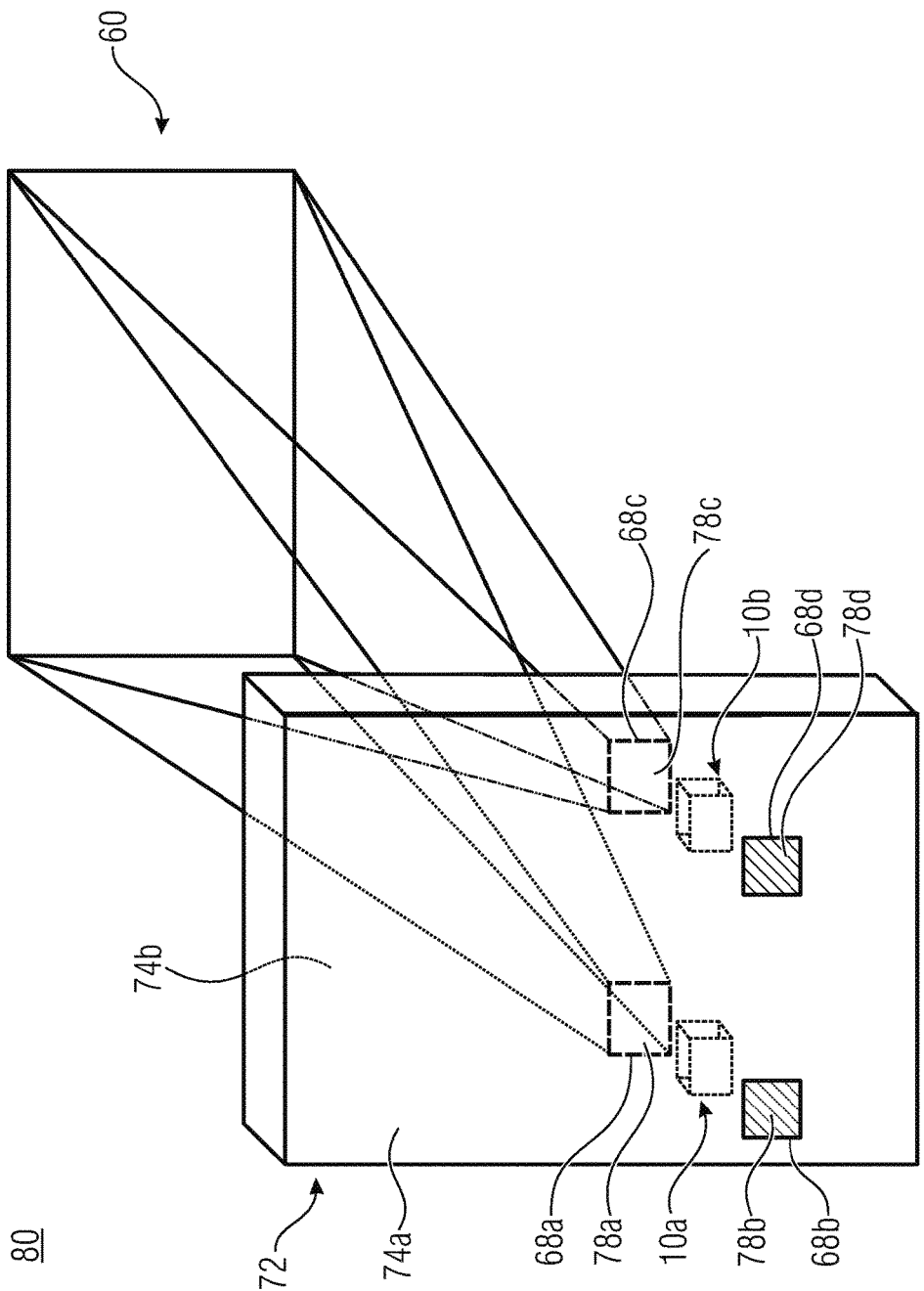
FIG. 8 is a schematic perspective view of a portable device including two multi-aperture imaging devices according to an embodiment.

FIG. 8 shows a schematic perspective view of a device 80 that includes a housing 72 and a first multi-aperture imaging device 10a and a second multi-aperture imaging device 10b arranged within the housing 72. The device 80 serves to detect the total field of view 70 stereoscopically using the multi-aperture imaging devices. The total field of view 70, for example, is arranged at a main side 74b of the housing facing away from the main side 74a. The multi-aperture imaging devices 10a and 10b may, for example, detect the total field of view 70 by transparent areas 68a and 68c, respectively, wherein diaphragms 78a and 78c that are arranged within the main side 74b are at least partially transparent. Diaphragms 78b and 78d that are arranged within the main side 74a may at least partially shut transparent areas 68b and/or 68d optically so that an extent of false light from one side facing the main side 74a, which may falsify the images captured by multi-aperture imaging devices 10a and/or 10b, is at least reduced. Although multi-aperture imaging devices 10a and 10b are spatially arranged with a distance from each other in space, the multi-aperture imaging devices 10a and 10b may also be arranged spatially adjacent or combined. The single-line arrays of imaging devices 10a and 10b may, for example, be arranged next to each other or parallel to each other. The single-line arrays may form lines to each other, each multi-aperture imaging device 10a and 10b comprising a single-line array. The imaging devices 10a and 10b may comprise a common beam-deflecting means, and/or a common carrier 62, and/or a common image sensor 12. Alternatively or additionally to the multi-aperture imaging device 10a and/or 10b, a multi-aperture imaging device 10, 10', 20, 30 or 40 may be arranged.

The transparent areas 68a-d may be additionally equipped with a switchable diaphragm 78a-d that covers the optical structure in the case of non-usage. The diaphragm 78a-d may comprise a part that is mechanically moved. The movement of the mechanically moved part may be performed using an actuator, for example, as described for actuators 36 and 45. The diaphragm 78a-d may alternatively or additionally be electrically controllable and comprise an electrochromic layer or an electrochromic layer sequence, i.e. be formed as electrochromic diaphragm.

Figure 9:
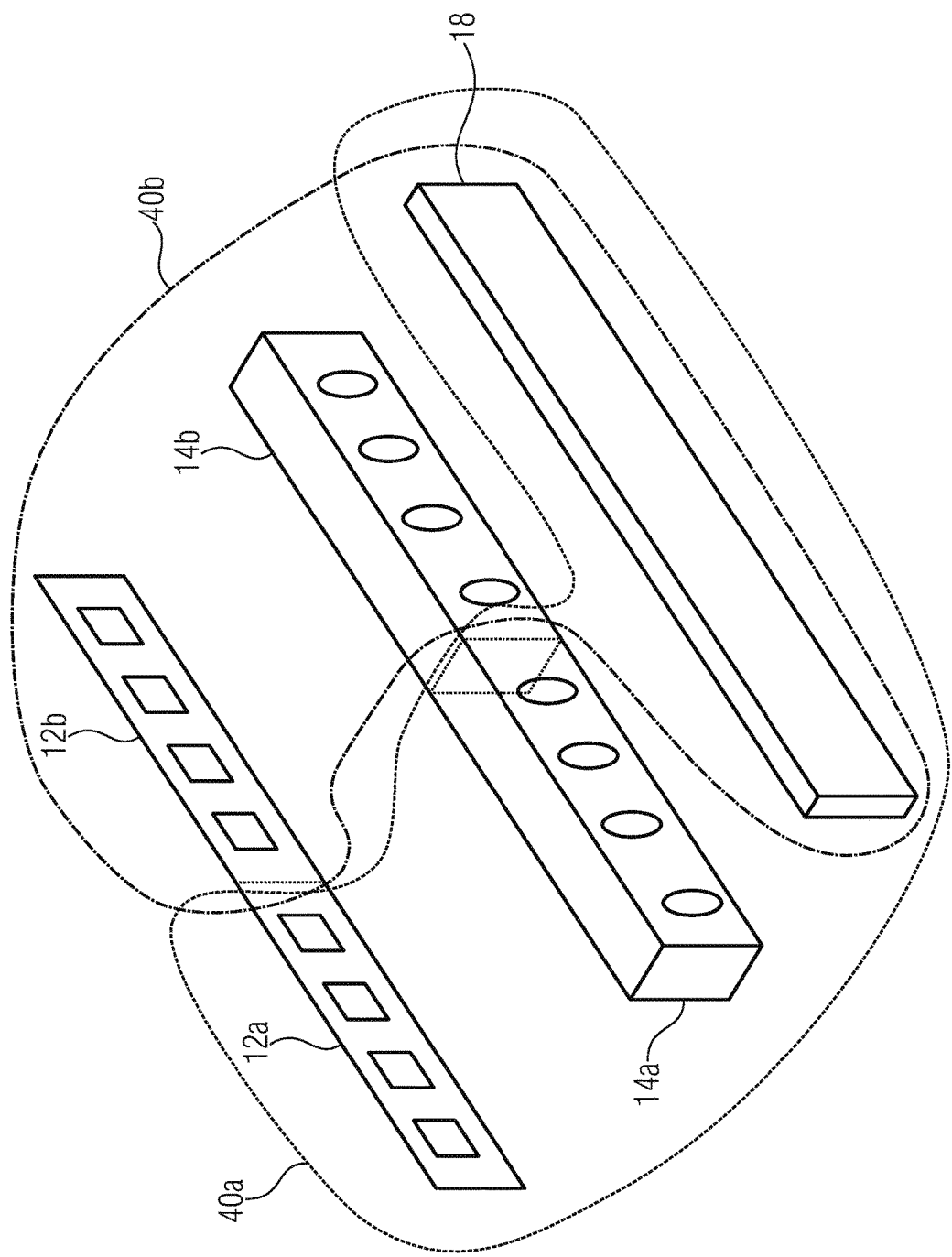
FIG. 9 shows a schematic structure including a first multi-aperture imaging device and a second multi-aperture imaging device having a common image sensor.

FIG. 9 shows a schematic structure comprising a first multi-aperture imaging device 10a and a second multi-aperture imaging device 10b as it may, for example, be arranged within the imaging system 80. Arrays 14a and 14b are formed with a single line and form a common line. Image sensors 12a and 12b may be mounted on a common substrate or on a common circuit carrier such as a common board or a common flex board. Alternatively, image sensors 12a and 12b may comprise mutually different substrates. Of course, different mixes of said alternatives are also possible, such as multi-aperture imaging devices comprising a common image sensor, a common array, and/or a common beam-deflecting means 18, as well as further multi-aperture imaging devices comprising separate components. A common image sensor, a common array, and/or a common beam-deflecting means is advantageous in that a high-precision movement of any component may be obtained by controlling a small number of actuators, and a synchronization between actuators may be reduced or prevented. Furthermore, a high thermal stability may be achieved. Alternatively or additionally, other and/or being mutually different multi-aperture imaging devices 10, 10', 20, 30, and/or 40 may also comprise a common array, a common image sensor, and/or a common beam-deflecting means.

Embodiments that are described herein enable multi-aperture imaging systems with linear channel arrangement, i.e. having one or more lines along a line extension direction, with optical image stabilization using uniaxial translatory movement between image sensor and imaging optics as well as uniaxial rotative movement of a beam-deflecting mirror array.

Although previously described embodiments are described such that a number of four optical channels or a multiple of the same is being arranged, multi-aperture imaging devices according to further embodiments may comprise an arbitrary number of optical channels, for example, at least two, at least three, at least four, at least ten or a higher number of optical channels may be arranged.

Although previously described embodiments are described such that the optical image stabilizer 22 comprises the actuator 36 and the actuator 42, according to further embodiments actuators 36 and 42 may also be formed as a common actuator. A movement that is generated by the actuator may, for example, be directed to the image sensor 12, the optical array 14, and/or the beam-deflecting means 18 by means of a power and/or displacement translator (transmission) in order to obtain a respective movement. Alternatively or additionally, one or more components may also be moved by several actuators, for example, as described in the context of multi-aperture imaging device 40.

The image sensor, for example, may be formed as complementary metal-oxide-semiconductor (CMOS) or technology that is different from the same. The optical channels of a respective array may be understood such that the same define an area in which an optical path that is directed to a respective image sensor area is optically changed. An optical path associated to an image sensor area therefore may pass through the optical channel of the array.

It has been previously referred to the fact that the optical paths or optical axes may be directed in mutually different directions, starting from the beam-deflecting means. This may be obtained by directing optical paths during a deflection at the beam-deflecting means and/or by optics, so as to no longer be parallel to one another. The optical paths or optical axes may be different from a parallelism before or without beam deflection. This is subsequently described by saying that the channels may be provided with a kind of pre-divergence. With this pre-divergence of optical axes, it would be possible that, for example, not all facet tilts are different from facets of the beam-deflecting means, but that some groups of channels, for example, have facets with the same tilt or are deflected to the same. The latter may then be formed integrally or continuously merging into one another that is as a facet that is associated to this group of channels that are adjacent in line extension direction. The divergence of optical axes of said channels may then originate from the divergence of said optical axes, as obtained by lateral offset between optical centers of optics of the optical channels and image sensor areas of the channels. The pre-divergence, for example, may be limited to one plane. The optical axes, for example, may be located in a common plane before or without beam deflection, nevertheless being divergent within the same, and the facets merely effect an additional divergence within the other transverse plane, i.e. all are tilted in parallel to the line extension direction and to one another only with differences to the previously mentioned common plane of optical axes, wherein here several facets may have the same tilt or be commonly associated to a group of channels whose optical axes, for example, already may differ in the previously mentioned common plane of optical axes in pairs before or without beam deflection. Simply stated, optics may enable a (pre-)divergence of optical paths along a first (image) direction and the beam-deflecting means may enable a divergence of optical paths along a second (image) direction.

The mentioned pre-divergence that might be present may, for example, be achieved by having the optical centers of the optics located on a straight line along the line extension direction, while the centers of the image sensor areas are arranged deviating from the projection of optical centers along the normal of the plane of the image sensor areas onto points on a straight line in the image sensor plane, for example at points that channel-specifically deviate from points on the previously mentioned straight line in the image sensor plane along the line extension direction and/or along the direction perpendicular to both the line extension direction and the image sensor normal. Alternatively, pre-divergence may be achieved by having the centers of image sensors located on a straight line along the line extension direction, while the centers of the optics are arranged deviating from the projection of the optical centers of image sensors along the normal of the plane of the optical centers of the optics onto points on a straight line in the plane of optical centers, for example at points that channel-specifically deviate from points on the previously mentioned straight line in the plane of optical centers along the line extension direction and/or along the direction perpendicular to both the line extension direction and the normal of the plane of optical centers. It is advantageous for the previously mentioned channel-specific deviation from the respective projection merely to be located in a line extension direction, i.e. only the optical axes located in merely one common plane to be provided with a pre-divergence. Both optical centers and image sensor area centers are located on a straight line, parallel to the line extension direction but with different distances in between. A lateral offset between lenses and image sensors in a perpendicular, lateral direction to the line extension direction, in contrast leads to an enlargement of the construction height. A mere in-plane offset in the line extension direction does not change the construction height but may result in fewer facets and/or the facets comprising only a tilt in an angle orientation which simplifies the structure. Optical channels adjacent to each other may, for example, comprise optical axes that are located within the common plane, squinting to each other, i.e. being provided with a pre-divergence. A facet may be arranged with respect to a group of optical channels, be tilted merely in one direction, and be parallel to the line extension direction.

Further, it could be provided that some optical channels are associated to the same partial field of view, for example, for super resolution or for increasing the resolution using which the respective partial field of view is sampled by said channels. The optical channels within such a group would run in parallel before beam deflection and would be deflected to a partial field of view by a facet. It would be advantageous, if pixel images of the image sensor of a group's channel would be located in intermediate positions between images of pixels of the image sensor of another channel of this group.

Even without the purpose of super resolution but merely for stereoscopic purposes, a configuration would be conceivable, wherein a group of immediately adjacent channels, in the line extension direction, completely cover the total field of view with their partial fields of view, and a further group of immediately adjacent to one another channels also completely cover the total field of view.

The above embodiments may also be implemented in form of a multi-aperture imaging device and/or an imaging system comprising such a multi-aperture imaging device, having a single-line channel arrangement, wherein each channel transfers a partial field of view of a total field of view and the partial fields of view are partially overlapping. A structure with several such multi-aperture imaging devices for stereo, trio, quattro, etc. structures for 3D image detection is possible. The plurality of modules may be formed as one continuous line. The continuous line may use identical actuators and a common beam-deflecting element. One or more reinforcing substrates that might be present in the optical path may extend across the whole line that forms a stereo, trio, quattro structure. Methods of super resolution may be used, wherein several channels project the same partial image areas. Even without beam deflection device, the optical axes may be divergent so that fewer facets may be used on the beam-deflecting unit. Advantageously, the facets then only have one angle component. The image sensor may be integral, have only one coherent pixel matrix, or several discontinued ones. The image sensor may be composed of several subsensors that, for example, are arranged next to each other on a printed circuit board. An autofocus drive may be configured such that the beam-deflecting element is moved synchronously with the optics or is idle.

Even though some aspects have been described within the context of a device, it is understood that said aspects also represent a description of the corresponding method, so that a block or a structural component of the device is also to be understood as a corresponding method step or as a feature of a method step. By analogy therewith, aspects that have been described within the context or as a method step also represent a description of a corresponding block or detail of a feature of a corresponding device.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A multi-aperture imaging device comprising:
an image sensor;
an array of optical channels, wherein each optical channel comprises optics for projecting a partial field of view of a total field of view on an image sensor area of the image sensor;
a beam deflector for deflecting an optical path of the optical channels;
an optical image stabilizer for an image stabilization along a first image axis by generating a translatory relative movement between the image sensor and the array and for an image stabilization along a second image axis by generating a rotational movement of the beam deflector; and at least one of
a focuser that comprises at least one actuator for adjusting a focus of the multi-aperture imaging device, wherein the focuser is arranged such that the same is at least partially arranged between two planes that are spanned by sides of a cuboid, the sides of the cuboid being aligned parallel to each other as well as to a line extension direction of the array and a part of the optical path of the optical channels between the image sensor and the beam deflector, and the volume of the same being minimal and nevertheless comprising the image sensor, the array, and the beam deflector; and
wherein the image stabilizer comprises at least one actuator and is arranged such that the same is at least partially arranged between two planes that are spanned by sides of a cuboid, the sides of the cuboid being aligned parallel to each other as well as to a line extension direction of the array and a part of the optical path of the optical channels between the image sensor and the beam deflector, and the volume of the same being minimal and nevertheless comprising the image sensor, the array, and the beam deflector.

2. The multi-aperture imaging device according to claim 1, wherein the image stabilizer protrudes from the area between the planes by a maximum of 50%.

3. The multi-aperture imaging device according to claim 1, wherein the at least one actuator of the image stabilizer comprises a voice-coil or a piezoelectric actuator.

4. The multi-aperture imaging device according to claim 1, wherein the focuser comprises an actuator for providing a relative movement between optics of one of the optical channels and the image sensor.

5. The multi-aperture imaging device according to claim 4, wherein the focuser is configured to perform the relative movement between the optics of one of the optical channels and the image sensor by performing a movement of the beam deflector that is simultaneous to the relative movement.

6. The multi-aperture imaging device according to claim 1, wherein the focuser is arranged such that the same protrudes from the area between the planes by a maximum of 50%.

7. The multi-aperture imaging device according to claim 1, wherein the at least one actuator of the focuser is at least one of a pneumatic actuator, a hydraulic actuator, a piezoelectric actuator, a direct-current motor, a stepper motor, a voice-coil motor, an electrostatic actuator, an electrostrictive actuator, a magnetostrictive actuator, and a thermal actuator.

8. The multi-aperture imaging device according to claim 1, wherein the array is formed in a single line.

9. The multi-aperture imaging device according to claim 1, wherein the beam deflector comprises a first position and a second position between which the beam deflector may be moved in a translatory manner along a line extension direction of the array, the beam deflector being configured to deflect, in the first position and in the in second position, the optical path of each optical channel in a mutually different direction.

10. The multi-aperture imaging device according to claim 9, wherein a translatory direction of movement along which the beam deflector may be moved in a translatory manner is parallel to the line extension direction.

11. The multi-aperture imaging device according to claim 1 that is arranged in a flat housing, wherein a first extension and a second extension of the housing along a first housing direction and a second housing direction comprise at least three times a dimension, compared to a third extension of the housing along a third housing direction.

12. The multi-aperture imaging device according to claim 1, wherein the beam deflector is formed as an array of facets that are arranged along the line extension direction.

13. An imaging system comprising a multi-aperture imaging device comprising:
an image sensor;

an array of optical channels, wherein each optical channel comprises optics for projecting a partial field of view of a total field of view on an image sensor area of the image sensor;

a beam deflector for deflecting an optical path of the optical channels;

an optical image stabilizer for an image stabilization along a first image axis by generating a translatory relative movement between the image sensor and the array and for an image stabilization along a second image axis by generating a rotational movement of the beam deflector, and at least one of a focuser that comprises at least one actuator for adjusting a focus of the multi-aperture imaging device, wherein the focuser is arranged such that the same is at least partially arranged between two planes that are spanned by sides of a cuboid, the sides of the cuboid being aligned parallel to each other as well as to a line extension direction of the array and a part of the optical path of the optical channels between the image sensor and the beam deflector, and the volume of the same being minimal and nevertheless comprising the image sensor, the array, and the beam deflector, and wherein the image stabilizer comprises at least one actuator and is arranged such that the same is at least partially arranged between two planes that are spanned by sides of a cuboid, the sides of the cuboid being aligned parallel to each other as well as to a line extension direction of the array and a part of the optical path of the optical channels between the image sensor and the beam deflector, and the volume of the same being minimal and nevertheless comprising the image sensor, the array, and the beam deflector, wherein the imaging system is implemented as a portable system.

14. The imaging system according to claim 13, comprising at least one further multi-aperture imaging device, wherein the imaging system is configured to detect a total field of view at least stereoscopically.

15. The imaging system according to claim 13 that is implemented as mobile phone, smartphone, tablet, or monitor.

16. A method for providing a multi-aperture imaging device comprising:

providing an image sensor;

arranging an array of optical channels, wherein each optical channel comprises optics for projecting a partial field of view of a total field of view on an image sensor area of the image sensor;

arranging a beam deflector for deflecting an optical path of the optical channels;

arranging an optical image stabilizer for an image stabilization along a first image axis by generating a translatory relative movement between the image sensor and the array and for an image stabilization along a second image axis by generating a rotational movement of the beam deflector; and at least one of arranging a focuser that comprises at least one actuator for adjusting a focus of the multi-aperture imaging device, wherein the focuser is arranged such that the same is at least partially arranged between two planes that are spanned by sides of a cuboid, the sides of the cuboid being aligned parallel to each other as well as to a line extension direction of the array and a part of the optical path of the optical channels between the image sensor and the beam deflector, and the volume of the same being minimal and nevertheless comprising the image sensor, the array, and the beam deflector; and arranging the image stabilizer such that the image stabilizer comprises at least one actuator and is arranged such that the same is at least partially arranged between two planes that are spanned by sides of a cuboid, the sides of the cuboid being aligned parallel to each other as well as to a line extension direction of the array and a part of the optical path of the optical channels between the image sensor and the beam deflector, and the volume of the same being minimal and nevertheless comprising the image sensor, the array, and the beam deflector.

* * * * *